US010147685B2

(12) United States Patent
Sommer et al.

(10) Patent No.: US 10,147,685 B2
(45) Date of Patent: Dec. 4, 2018

(54) SYSTEM-IN-PACKAGE DEVICES WITH MAGNETIC SHIELDING

(71) Applicant: Apple Inc., Cupertino, CA (US)

(72) Inventors: Phillip R. Sommer, Newark, CA (US); Shankar Pennathur, San Jose, CA (US); Meng Chi Lee, Los Altos, CA (US); Shakti S. Chauhan, Cupertino, CA (US); Yanfeng Chen, San Ramon, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/403,046

(22) Filed: Jan. 10, 2017

(65) Prior Publication Data

US 2017/0263569 A1    Sep. 14, 2017

Related U.S. Application Data

(60) Provisional application No. 62/306,302, filed on Mar. 10, 2016.

(51) Int. Cl.
*H01L 23/552* (2006.01)
*H01L 23/31* (2006.01)
(Continued)

(52) U.S. Cl.
CPC .......... *H01L 23/552* (2013.01); *H01L 21/268* (2013.01); *H01L 21/2855* (2013.01); *H01L 21/2885* (2013.01); *H01L 21/32051* (2013.01); *H01L 23/3121* (2013.01); *H01L 23/49838* (2013.01); *H01L 24/81* (2013.01); *H01L 25/0652* (2013.01); *H01L 25/0655* (2013.01);
(Continued)

(58) Field of Classification Search
None
See application file for complete search history.

(56) References Cited

U.S. PATENT DOCUMENTS 8,118,990 B2    2/2012  Liu et al.
9,269,673 B1 *  2/2016  Lin ........................ H01L 24/97
(Continued)

OTHER PUBLICATIONS

Robertson, "Electrodeposition of Magnetic Materials", HGST, a Western Digital Company, San Jose Research Center, San Jose, California, 2012.

*Primary Examiner* — Charles D. Garber
*Assistant Examiner* — Xiaoming Liu
(74) *Attorney, Agent, or Firm* — Treyz Law Group, P.C.; G. Victor Treyz; David K. Cole (57) ABSTRACT

Electrical components may be packaged using system-in-package configurations or other component packages. Integrated circuit dies and other electrical components may be soldered or otherwise mounted on printed circuits. A layer of encapsulant may be used to encapsulate the integrated circuits. A shielding layer may be formed on the encapsulant layer to shield the integrate circuits. The shielding layer may include a sputtered metal seed layer and an electroplated layer of magnetic material. The electroplated layer may be a magnetic material that has a high permeability such as permalloy or mu metal to provide magnetic shielding for the integrated circuits. Integrated circuits may be mounted on one or both sides of the printed circuit. A temporary carrier and sealant may be used to hold the encapsulated integrated circuits during electroplating.

30 Claims, 11 Drawing Sheets

(51) Int. Cl.
  *H01L 25/065* (2006.01)
  *H01L 23/498* (2006.01)
  *H01L 21/288* (2006.01)
  *H01L 21/3205* (2006.01)
  *H01L 21/285* (2006.01)
  *H01L 21/268* (2006.01)
  *H01L 23/00* (2006.01)
  *H01L 21/56* (2006.01)

(52) U.S. Cl.
  CPC ............ *H01L 21/561* (2013.01); *H01L 24/13* (2013.01); *H01L 24/16* (2013.01); *H01L 24/75* (2013.01); *H01L 24/97* (2013.01); *H01L 2224/0401* (2013.01); *H01L 2224/131* (2013.01); *H01L 2224/16227* (2013.01); *H01L 2224/7565* (2013.01); *H01L 2224/81801* (2013.01); *H01L 2224/97* (2013.01); *H01L 2225/06517* (2013.01); *H01L 2225/06572* (2013.01); *H01L 2924/0104* (2013.01); *H01L 2924/01013* (2013.01); *H01L 2924/01026* (2013.01); *H01L 2924/01027* (2013.01); *H01L 2924/01028* (2013.01); *H01L 2924/01029* (2013.01); *H01L 2924/0132* (2013.01); *H01L 2924/0133* (2013.01); *H01L 2924/01073* (2013.01); *H01L 2924/14* (2013.01); *H01L 2924/15192* (2013.01); *H01L 2924/15311* (2013.01); *H01L 2924/15313* (2013.01); *H01L 2924/1815* (2013.01); *H01L 2924/3025* (2013.01)

(56) References Cited

U.S. PATENT DOCUMENTS

| | | |
|---|---|---|
| 2010/0246144 A1 | 9/2010 | Yamazaki et al. |
| 2011/0261550 A1* | 10/2011 | Wong .................... H01L 21/561 |
| | | 361/818 |
| 2015/0030878 A1* | 1/2015 | Zhi ....................... H05K 9/0088 |
| | | 428/650 |
| 2015/0271959 A1 | 9/2015 | Chen et al. |
| 2016/0276288 A1* | 9/2016 | Lee ....................... H01L 23/552 |

* cited by examiner

SYSTEM-IN-PACKAGE DEVICES WITH MAGNETIC SHIELDING

This application claims the benefit of provisional patent application No. 62/306,302, filed Mar. 10, 2016, which is hereby incorporated by reference herein in its entirety.

FIELD

This relates generally to shielding and, more particularly, magnetic shielding for devices such as system-in-package devices.

BACKGROUND

Electronic equipment often contains components that are subject to signal interference. Metal shield cans may be used to cover integrated circuits and other components and thereby help to suppress electromagnetic interference. Magnetic materials may be used to form shield cans that help suppress magnetic fields. An example of a magnetic material that can be used in forming magnetic shielding cans is the high permeability nickel-iron magnetic alloy that is sometimes referred to as mu-metal.

It can be challenging to design effective shielding for portable electronic devices and other environments in which components are mounted in close proximity to each other. If care is not taken, shielding structures will be more bulky than desired, will not be as effective at shielding components from each other as desired, and will be difficult to manufacture.

SUMMARY

System-in-package devices and other packaged electrical components may be provided with shielding. The shielding may include high conductivity metal layers that serve as radio-frequency shielding and magnetic material layers that serve as magnetic shielding. The shielding may be formed on the surface of the devices and may extend into grooves within encapsulation layers in the devices. Shielding may also be formed within substrate layers for the devices.

Integrated circuit dies and other electrical components may be soldered or otherwise mounted on printed circuits that serve as package substrates. A layer of encapsulant may be used to encapsulate the integrated circuits.

A shielding layer may be formed on the encapsulant layer to shield the integrated circuits. The shielding layer may include a sputtered metal seed layer and an electroplated layer of magnetic material. The electroplated layer may be a magnetic material that has a high permeability such as permalloy or mu metal. Layers of shielding material may also be deposited using spraying, printing, and other techniques. For example, electroless plating techniques may be used. With electroless plating, a seed layer need not be used. If desired, the shielding layer may be formed by sputtering only. Combinations of these approaches may also be used (e.g., electroless plating in combination with electroplating and/or sputtering, printing, and/or other techniques).

Integrated circuits may be mounted on one or both sides of the printed circuit and may be covered with a magnetic shielding layer on one or both sides of the printed circuit. A temporary carrier and sealant may be used to hold encapsulated integrated circuits during electroplating.

DETAILED DESCRIPTION

Electronic devices may be provided with electrical components such as integrated circuits, discrete electrical components such as inductors, capacitors, and resistors, and other electrical components. Shielding may be used to prevent interference between components. In some scenarios, components may be packaged in multi-component packages using system-in-package technology. Arrangements in which shielding is provided in the context of system-in-package devices may sometimes be described herein as an example. In general, any suitable electrical component may be provided with shielding. The use of system-in-package devices is merely illustrative.

Figure 1:
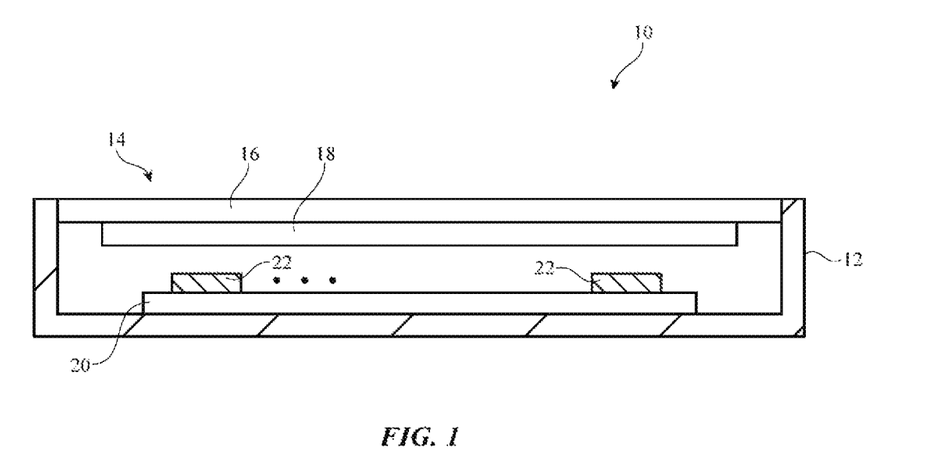
FIG. 1 is a cross-sectional side view of an illustrative electronic device in accordance with an embodiment.

A cross-sectional side view of an illustrative electronic device of the type that may include shielded electrical components is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, an accessory (e.g., earbuds, a remote control, a wireless trackpad, etc.), or other electronic equipment.

As shown in FIG. 1, device 10 may include components such as display 14. Display 14 may be mounted in housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.).

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Display 14 may be protected using a display cover layer such as display cover layer 16. A liquid crystal display module, organic light-emitting diode display, or other display structures (shown as display module 18 in the example of FIG. 1) may be mounted below display cover layer 16. In some configurations for device 10, display 14 may be omitted. The arrangement of FIG. 1 in which device 10 includes display 14 is merely illustrative.

As shown in the cross-sectional side view of electronic device 10 of FIG. 1, electronic device 10 may include internal device components such as devices 22. Devices 22 may include sensors, integrated circuits, buttons, connectors, and other circuitry. If desired, one or more components such as devices 22 may be a system-in-package (SiP) device. A component formed using system-in-package technology includes multiple integrated circuits packaged in a common package.

In the interior of electronic device 10, devices 22 may be mounted on one or more substrates such as substrate 20. Substrate 20 may be a dielectric carrier such as a molded plastic carrier or a printed circuit. For example, substrate 20 may be a printed circuit such as a rigid printed circuit formed from a material such as fiberglass-filled epoxy or may be a flexible printed circuit formed from a sheet of polyimide or other flexible polymer layer.

Figure 2:
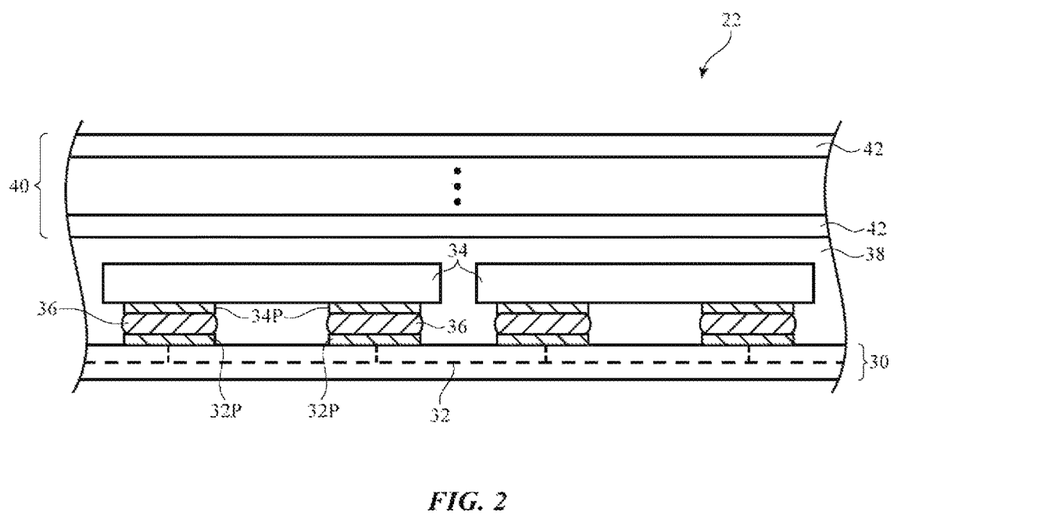
FIG. 2 is a cross-sectional side view of a portion of an illustrative packaged device of the type that may be used in the electronic device of FIG. 1 in accordance with an embodiment.

A cross-sectional side view of a portion of an illustrative system-in-package device (sometimes referred to as a system-in-package or system-in-package component) is shown in FIG. 2. As shown in FIG. 2, system-in-package device 22 may include a substrate such as substrate 30. Substrate 30 may be a printed circuit or other package substrate that includes one or more layers of signal interconnects 32 (e.g., one or more layers of patterned metal traces). Interconnects 32 may include contacts such as solder pads 32P. Pads 32P may be formed on the upper surface of substrate 30 (as an example). Contacts formed from interconnects 32 may also be located on the lower surface of substrate 30 (e.g., to facilitate mounting of device 22 to printed circuit 20).

Integrated circuits 34 (i.e., silicon integrated circuit dies) may have contacts such as solder pads 34P that mate with contacts 32P on the upper surface of printed circuit 30. A soldering tool or other equipment may use solder 36 or other conductive material (e.g., conductive adhesive, etc.) to mount integrated circuits 34, discrete components, and other circuitry to pads 32P on substrate 30. After integrated circuits (integrated circuit dies) 34 have been mounted to substrate 30, integrated circuits 34 may be encapsulated using dielectric encapsulant such as encapsulant (encapsulation) layer 38. Layer 38 may be a polymer such as a thermoset or thermoplastic polymer and may sometimes be referred to as a mold cap (e.g., when layer 38 is formed by molding plastic over integrated circuits 34). Device 22 may have a land-grid-array (LGA) form factor, a ball-grid-array (BGA) form factor, or any other suitable form factor. The configuration of FIG. 2 is merely illustrative.

Shielding layer 40 may be formed on one or more of the surfaces of system-in-package device 22. As shown in FIG. 2, shielding layer 40 may, if desired, include multiple sublayers of material such as layers 42. Layers 42 may include metal, non-metallic materials, magnetic materials, dielectric, and/or other layers of material. Electromagnetic shielding layers may be formed, for example, from a first layer of stainless steel (e.g., an inner layer), a second layer of stainless steel (e.g., an outer layer), and an interposed conductive layer such as a layer of copper or other conductive metal.

To help suppress magnetic fields, shielding layer 40 preferably includes one or more magnetic shielding layers. For example, shielding layer 40 may include one or more layers of soft magnetic materials such as NiFe (e.g., Ni80Fe20, Ni45Fe55, Ni82Fe18, Ni55Fe45, etc.), CZT (CoZrTa), Co, CoNiFe, Ni, CoNi, Co, Cobalt-based amorphous alloys (e.g., CoZrTa alloy), and mu-metal (e.g., an alloy of Ni, Fe, Cu, and a metal such as Cr or Mo such as Ni80Mo5Fe15), ferrites (e.g., a ferrimagnetic ceramic formed from iron oxide with metallic elements), nickel-iron alloys such as permalloy, other nickel iron alloys, or other high permeability material. Non-corrosive coating layers may, if desired, by incorporated into layer 40 (e.g., a stainless steel coating layer may be formed on a high permeability magnetic shielding layer such as a mu-metal layer to help prevent corrosion). The relative permeability of the layer(s) of magnetic material in layer 40 may be 2000 or more, may be 5000 or more, may be 10,000 or more, may be 20,000 or more, may be 80,000 or more, may be 5,000-100,000, may be 50,000-100,000, may be less than 100,000, or may have any other suitable value that allows the layer(s) to serve as magnetic shielding for device 22.

Figure 3:
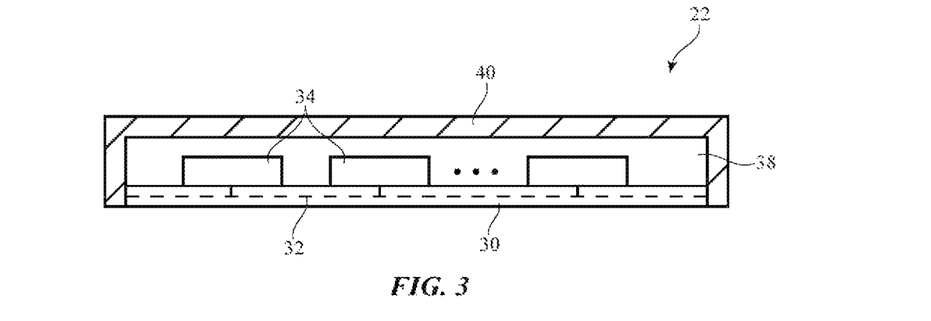
FIG. 3 is a cross-sectional side view of an illustrative packaged device with a shielding layer that covers a top surface and side surfaces of an encapsulation layer in accordance with an embodiment.
Figure 4:
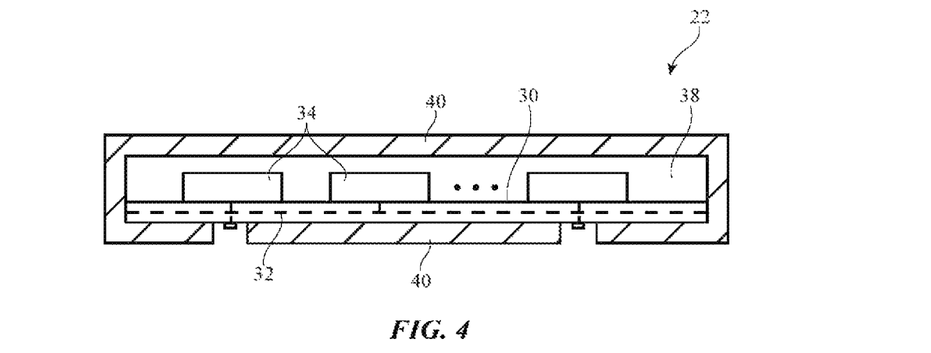
FIG. 4 is a cross-sectional side view of an illustrative packaged device with a shielding layer that covers top, side, and rear device surfaces in accordance with an embodiment.

A cross-sectional side view of an illustrative configuration for incorporating shielding layer 40 onto the sides and upper (outer) surface of device 22 is shown in FIG. 3. As shown in FIG. 3, interconnects 32 (e.g., ground traces in interconnects 32) may contact portions of shielding layer 40 along the edges of device 22. In the example of FIG. 4, shielding layer 40 has been formed on the upper surface of encapsulation layer 38 and extends over the edge surfaces of encapsulation layer 38 and the exposed ground lines (interconnects 32) on the edges of substrate 30 (i.e., layer 40 covers the upper surface of device 22). If desired, shielding layer 40 may cover the opposing lower (rear) surface of device 22, as shown in the illustrative configuration of device 22 in FIG. 4.

Figure 5:
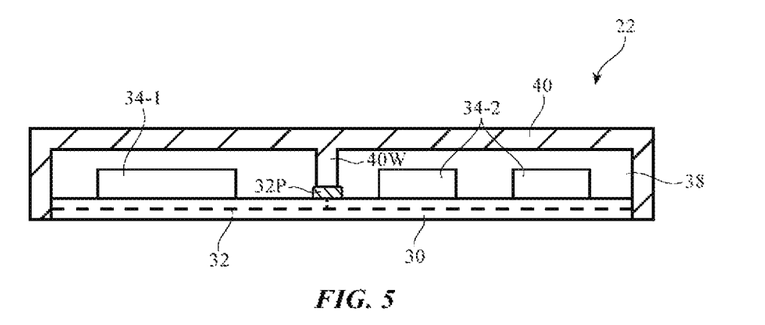
FIG. 5 is a cross-sectional side view of an illustrative packaged device with a shielding layer that penetrates into grooves in an encapsulant layer to form shielding walls between components in the package in accordance with an embodiment.

If desired, shielding layer 40 may be used to form dividing walls such as shielding wall 40W of FIG. 5. As shown in FIG. 5, shielding wall 40W may be formed from a portion of shielding layer 40 that penetrates into a groove in encapsulant 38. Shielding wall 40W may be interposed between one or more integrated circuits in a first set of electrical components (see, e.g., component 34-1) and one or more integrated circuits in a second set of electrical components (see, e.g., components 34-2). This type of arrangement may be used, for example, to help shield components 34-2 from a noisy component such as component 34-1. Shielding wall 40W may be formed from shielding layer material that penetrates to the surface of substrate 30 and that contacts a ground trace such as ground contact (pad) 32P in interconnects 32.

Figure 6:
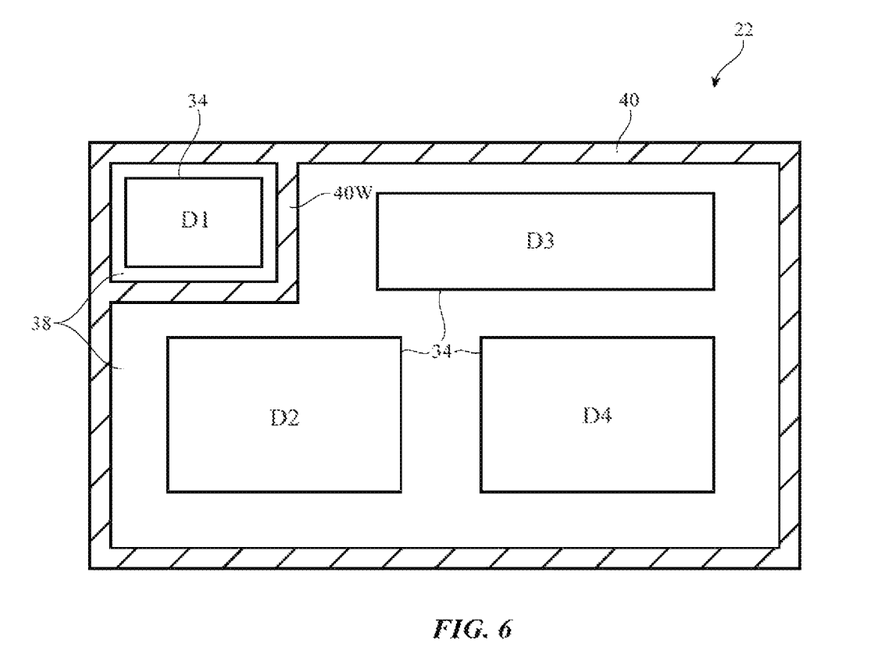
FIG. 6 is a top view of an interior portion of an illustrative packaged device of the type shown in FIG. 5 in accordance with an embodiment.

A top view of an interior portion of an illustrative system-in-package device 22 in which shielding wall 40W is present is shown in FIG. 6. As shown in FIG. 6, electrical components 34 may include a component (component D1) that is being shielded from three additional components (D2, D3, and D4) by shielding wall 40W. Shielding wall 40W may have a rectangular ring shape, may be joined to sidewall portions of shielding layer 40 (as shown in the example of FIG. 6), may have the shape of a straight interior partition that divides a rectangular device 22 into first and second portions, or may have any other suitable shape. The arrangement of FIG. 6 is merely illustrative.

Figure 7:
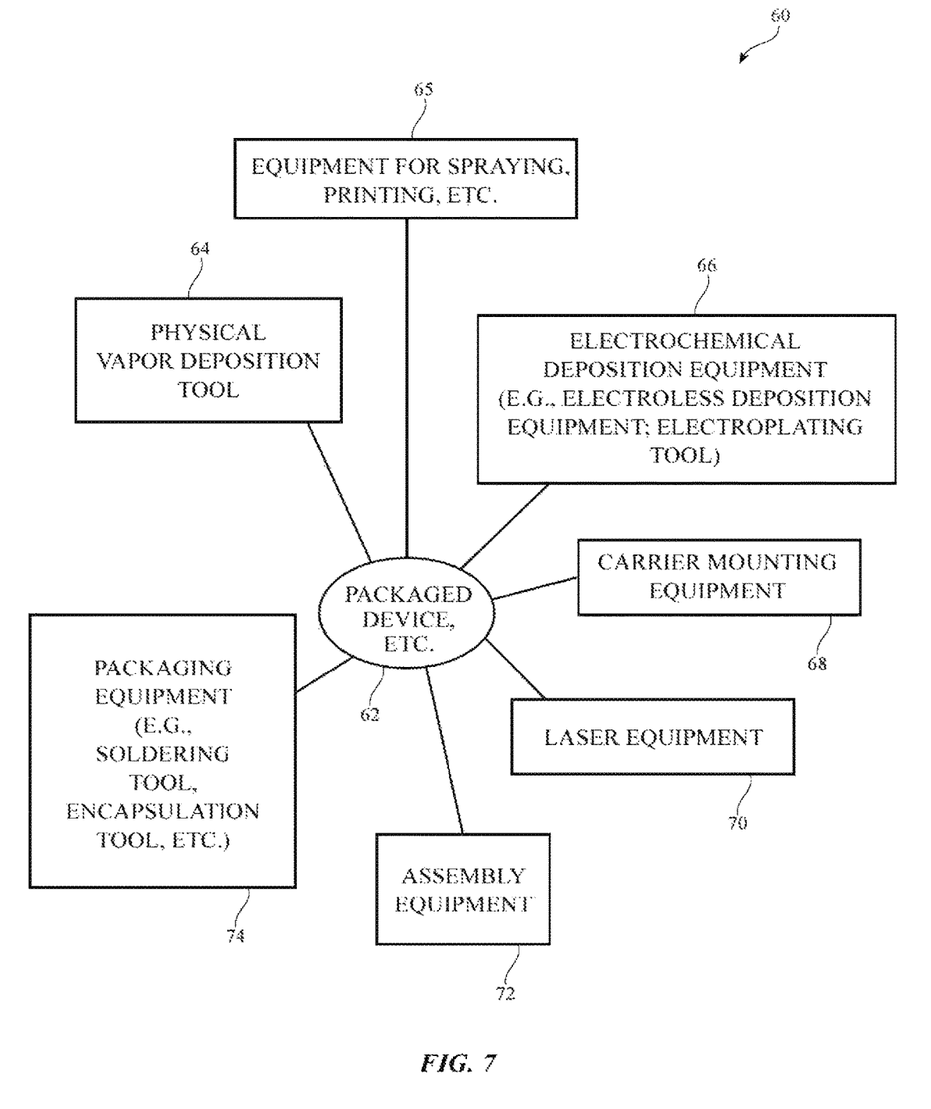
FIG. 7 is a diagram of illustrative equipment of the type that may be used in fabricating packaged devices with shielding and assembling these devices to form a finished electronic device in accordance with an embodiment.

Illustrative equipment of the type that may be used in fabricating an electronic device having shielded system-in-package devices 22 and other packaged devices is shown in FIG. 7. As shown in FIG. 7, structures 62 (e.g., partly and/or completely formed devices 22 and other components of electrical device 10) may be processed using the tools of system 60 to form a completed device (e.g., a cellular telephone, watch, portable computer, or other electronic device 10).

Physical vapor deposition tool 64 may include evaporation equipment, sputtering equipment, or other tools for depositing metal or other materials. Tool 64 may, for example, include a sputtering tool for depositing a thin metal seed layer onto device 22 to facilitate subsequent electrochemical deposition operations. The seed layer may be formed from gold, stainless steel, silver, or a layer of other metal through which current may pass to initiate electrochemical deposition operations (e.g., electroplating).

Electrochemical deposition equipment 66 may be used to deposit layers of material (e.g., one or more layers 42 for layer 40 or other layers) for forming device 22. Equipment 66 may include electroless deposition equipment, electroplating equipment, or other suitable electrochemical deposition equipment. Magnetic materials (e.g., magnetic shielding layers) and other materials may be deposited to form layers 42 using tool 64, equipment 66, and other suitable deposition tools.

Packaging equipment 74 may include a soldering tool (e.g., a pick and place tool or other equipment for soldering integrated circuits and other components to a printed circuit board or other substrate 30). Equipment 74 may also include injection molding equipment or other equipment for molding or otherwise forming desired encapsulation layer structures (mold caps) such as encapsulant layer 38 on device 22. Equipment 74 may, for example, include equipment for depositing liquid polymer material that forms a solid encapsulation layer after cooling and/or curing.

A temporary carrier such as a printed circuit carrier or other carrier may be used to support devices 22 during the formation of shielding layer 40. Carrier mounting equipment 68 may be used to temporarily mount devices 22 on the carrier substrate. Equipment 68 may include, for example, equipment for depositing a sealant (e.g. a liquid polymer sealant), equipment for curing the sealant (e.g., an ultraviolet light for ultraviolet-light-curing the sealant), computer-controlled positioners for attaching and removing devices 22 from the carrier, and other equipment.

Laser equipment 70 may include one or more lasers and associated computer-controlled positioners. Using a laser processing tool of this type, a beam of focused laser light may be scanned across the surface of each of devices 22, thereby drilling (i.e., cutting by thermal dissociation, ablation, etc.) one or more grooves through encapsulant 38. A portion of shielding layer 40 may then be formed in the groove(s) to form shielding walls such as shielding wall portion 40W of layer 40 in FIGS. 5 and 6.

If desired, layers of soft magnetic material for magnetic shielding, high conductivity metals such as copper and aluminum for radio-frequency shielding, and/or other layers of material may be deposited using equipment 65. Equipment 65 may include tools for depositing liquids (e.g., thin polymer resins) that contain particles of soft magnetic material. Equipment 65 may, for example, include spraying equipment, ink-jet printing equipment, pad printing equipment, screen printing equipment, other tools for depositing soft magnetic materials by printing, or may include other deposition equipment. Soft magnetic material may also be deposited by lamination (e.g., lamination of soft magnetic foils with other layers), and/or other deposition techniques. The illustrative equipment of FIG. 7 is merely illustrative.

Assembly equipment 72 may be used to complete assembly operations for device 10. In particular, after forming shielded electrical components such as shielded system-in-package device 22 using other equipment in system 60, equipment 72 (e.g., robotic assembly equipment) may be used in soldering devices 22 to substrates such as substrate 20 of FIG. 1, may be used in coupling substrates such as substrate 20 of FIG. 1 to display 14 and other components, and may be used in mounting devices 22 and other circuitry for device 10 within housing 12 to complete assembly of electronic device 10.

Figure 8:
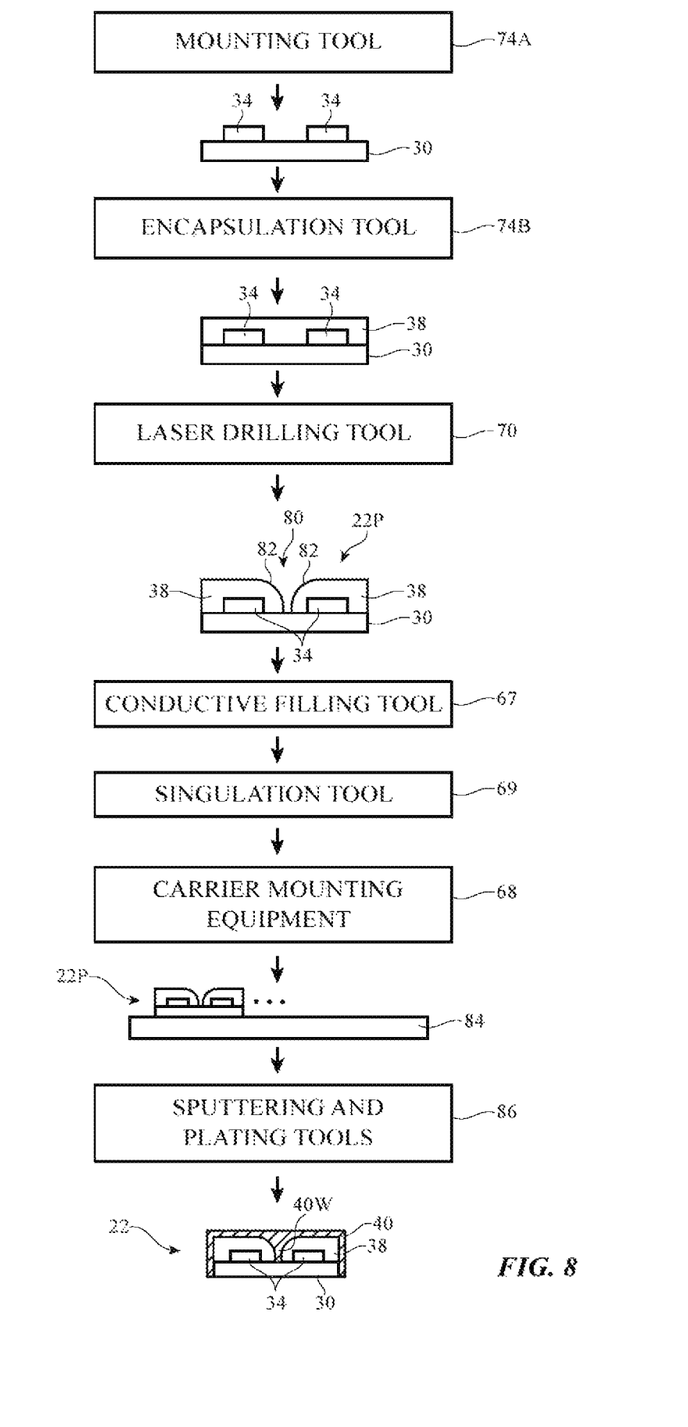
FIG. 8 is a diagram of equipment and operations involved in forming shielded system-in-package devices and other shielded components in accordance with an embodiment.

Illustrative equipment and operations for forming shielding on components such as system-in-package device 22 are shown in FIG. 8.

Initially a pick-and-place tool, other soldering tool, or other mounting equipment 74A may be used in soldering or otherwise mounting integrated circuits 34 and/or other circuit components on substrate 30. Encapsulation tool 74B may be used to encapsulate mounted components 34 with encapsulant (i.e., encapsulant layer 38).

If desired, optional grooves for shielding walls 40W may be formed in encapsulation layer 38. For example, laser drilling tool 70 or other groove formation equipment may be used to cut through encapsulation layer 38 and remove the material in groove 80, thereby forming partially completed system-in-package device structures 22P. To facilitate subsequent deposition of a sputtered metal seed layer into groove 80, the sidewalls of groove 80 may be provided with a tapered profile, as shown by illustrative outwardly flared groove sidewall surfaces 82 in partially completed devices 22P.

Optional conductive filling tool 67 may be used to fill groove 80 with conductive epoxy or other conductive fill. After curing, the conductive fill may form shielding walls such as wall 40W of FIG. 6. With this type of arrangement, sputtering and plating operations to form shielding walls 40W can be omitted.

After forming groove 80 with laser tool 70, singulation tool 69 may be used to dice or laser cut a panel or strip of system-in-package device structures 22P into individual system-in-package devices.

To enhance throughput when forming shielding layer 40 on system-in-package devices, multiple devices may be supported by a common carrier structure. For example, carrier mounting equipment 68 may mount multiple partially completed system-in-package devices 22P on carrier layer

84. Carrier layer 84 may be a plastic support structure or a rigid or flexible printed circuit. Illustrative configurations in which carrier layer 84 is a rigid printed circuit may sometimes be described herein as an example. Carrier mounting equipment 68 may include sealant dispensing equipment such as a needle dispenser, screen printing equipment, inkjet printing equipment, or other equipment for dispensing a ring of adhesive or other sealant around the base of each component 34 when mounting components 34 to carrier 84. The ring of sealant may hold devices 22P to carrier 84. Carrier 84 may contain metal traces for carrying plating current and contacts that mate with corresponding contact(s) on devices 22P. The contacts on carrier 84 may be used to applying current to a seed layer on the outside of devices 22P during electroplating operations. The ring of sealant that is interposed between the periphery of each device 22P and carrier 84 may prevent electroplating solution from contacting potentially sensitive components on devices 22P such as exposed contact pads.

After attaching devices 22P to carrier 84 and using sealant to prevent liquid intrusion under devices 22P when carrier 84 is immersed in liquid, equipment 86 may be used to form shielding layer 40. With one suitable arrangement, at least one sputter-deposited layer of material is formed on devices 22P such as a sputtered seed layer of metal. The seed layer may be a relatively thin layer (e.g., a layer of less than 1 micron in thickness, a layer of less than 0.5 microns in thickness, etc.). Due to the tapered profile of groove 80, the seed layer may be deposited onto the inner sidewalls of groove 80 (i.e., onto curved groove surfaces 82) and onto the metal contacts at the bottom of groove 80. Once the seed layer has been deposited, current may be applied to the seed layer through signal paths in carrier 84 while carrier 84 and devices 22P are submerged within a liquid electroplating bath using a signal source (current source). This electroplating process may be used to grow (electroplate) relatively thick layers of material (e.g., layers with thicknesses of 1-5 microns, 1-20 microns, 2-10 microns, less than 30 microns, more than 2 microns, or other suitable thicknesses). The plated material may be, for example, one or more layers 42 such as magnetic material layers (magnetic shielding layers), anti-corrosion coating layers, adhesion layers, conductive electromagnetic shielding layers, etc. If desired, layers 42 may include a combination of multiple layers formed using different deposition techniques (e.g., sputtering or other physical vapor deposition techniques, electroplating, electroless deposition (e.g., electroless plating without using a seed layer, electroless plating in combination with electroplating and/or sputtering, etc.), chemical vapor deposition, atomic layer deposition, etc.).

In scenarios in which grooves 80 are not formed in encapsulant layer 38, layer 40 may form a planar surface layer that covers the surface of encapsulant 38 (and, if desired, the rear surface of substrate 20, as shown in FIG. 4). In scenarios in which grooves 80 were formed in encapsulant 38, the deposited material of layer 40 (i.e., the sputtered seed layer and the one or more subsequently deposited layers such as one or more electroplated layers of magnetic material, etc.) may be deposited in groove 80 to form shielding walls 40W.

Figure 9:
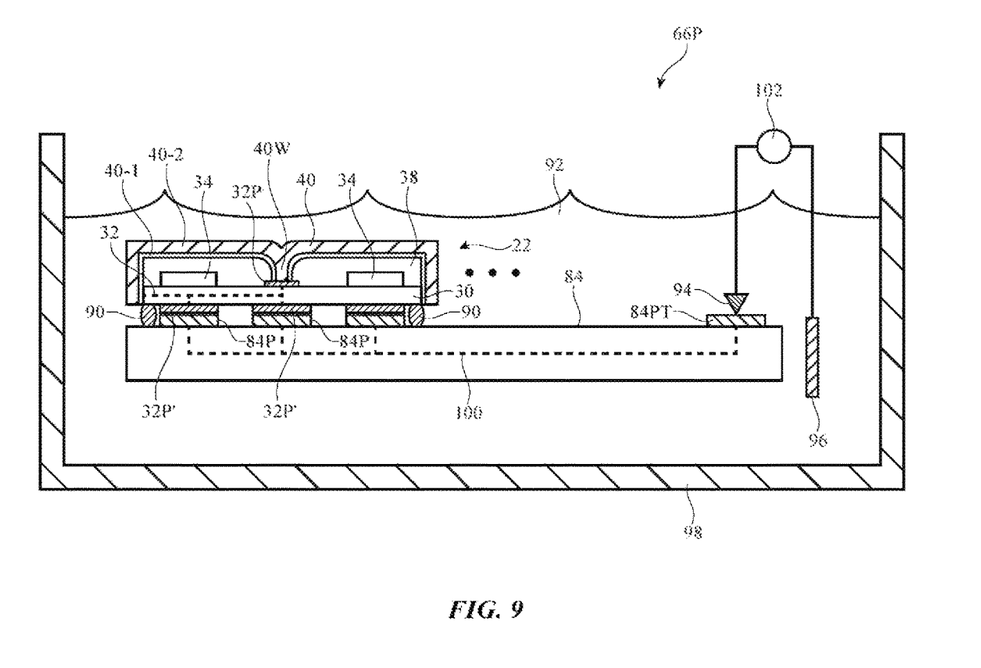
FIG. 9 is a side view of an illustrative electroplating system of the type that may be used in forming shielding for packaged electrical components in accordance with an embodiment.

FIG. 9 is a diagram showing an illustrative electroplating arrangement for forming shielding layer 40 onto device 22. As shown in FIG. 9, electroplating tool 66P may have an electroplating bath 92 in receptacle 98 in which devices 22 and carrier 84 are immersed. Tool 66P may apply current to electrodes 94 and 96 during electroplating operations. Electrode 96 may be in contact with electroplating bath 92. Electrode 94 may be shorted to pad 84PT on carrier 84. Carrier traces such as path 100 may short contact 84PT and therefore electrode (terminal) 94 to contacts such as pads 84P on carrier 84.

Equipment 68 (FIG. 8) may apply a ring of adhesive such as sealant 90 between devices 22 and carrier 84. Sealant 90 may, for example, be a reworkable elastomeric adhesive such as an ultraviolet light cured liquid adhesive. Equipment 68 may include a dispensing tool that deposits sealant 90 in a ring shape that is interposed between the lower surface of substrate 30 of device 22 and the opposing upper surface of carrier 84. Equipment 68 may also include an ultraviolet light source that applies ultraviolet light to sealant 90 to cure sealant 90. Devices 22 may have exposed lower surface contacts such as solder pads 32P'. During normal use in device 10, contacts 32P' may allow devices 22 to be soldered to substrates such as printed circuit 20 (FIG. 1). During electroplating operations, contacts 32P' on the outer surface of system-in-package substrate 30 serve as back (outer surface) ground contacts for completing a plating circuit in electroplating bath 92 and may mate with corresponding contacts 84P on the upper surface of carrier 84. The ring of sealant 90 between substrate 30 and carrier 84 may surround contacts 32P' and 84P and thereby prevent liquid bath 92 from penetrating under devices 22 and reaching contacts 34P' and 84P.

Carrier 84 may have metal traces that form interconnect lines such as path 100. Path 100 may short contact 84PT to one or more of contacts 84P. Contacts 84P mate with corresponding contacts 32P' on the lower surfaces of devices 22 and are therefore shorted to contacts 32P'. Contacts 32P', in turn, are shorted to sputter deposited seed layer 40-1 by paths 32 in substrate 30. Layer 40-1 may be deposited using physical vapor deposition equipment 64 of FIG. 7 such as sputtering equipment (see, e.g., equipment 86 of FIG. 8) prior to immersion of carrier 84 in bath 92. The presence of layer 40-1 and the current applied using signal source 102 causes one or more layers of magnetic material or other material to plate from bath 92 onto the outer surface of sputtered layer 40-1, as shown by electroplated layer 40-2 of FIG. 9. Following electroplating operations to form one or more layers 42 for shield layer 40 in this way, devices 22 may be removed from temporary carrier 84 and sealant 90 may be peeled away from devices 22. Devices 22 may then be mounted on printed circuit boards such as printed circuit 20 of FIG. 1.

Figure 10:
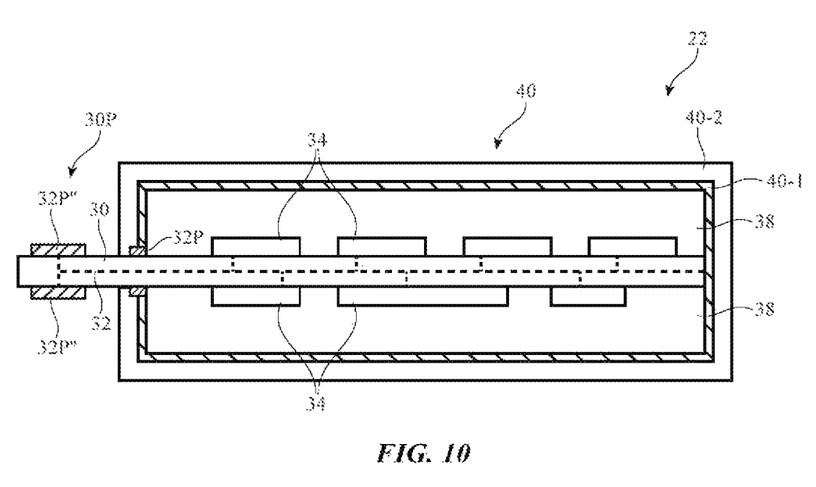
FIG. 10 is a cross-sectional side view of an illustrative system-in-package device having double-sided shielding in accordance with an embodiment.

If desired, electroplating operations with system 66P may be used to electroplate metal layer 40-2 onto both sides of devices 22, as shown in the illustrative configuration for device 22 of FIG. 10. In the illustrative arrangement of FIG. 10, substrate 30 has been provided with a protruding portion 30P onto which contacts 32P''' have been formed. Contacts 32P''' may be shorted to seed layer 40-1 so that current can be applied to seed layer 40-1 to help electroplate layer 40-2 onto the outer surface of device 22 when device 22 is mounted on a carrier in bath 92. The carrier used for processing multisided devices such as device 22 of FIG. 10 may be the same as carrier 84 of FIG. 9 or may have other structures for forming temporary electrical connections between carrier contacts 84P and system-in-package substrate contacts 32P'.

Figure 11:
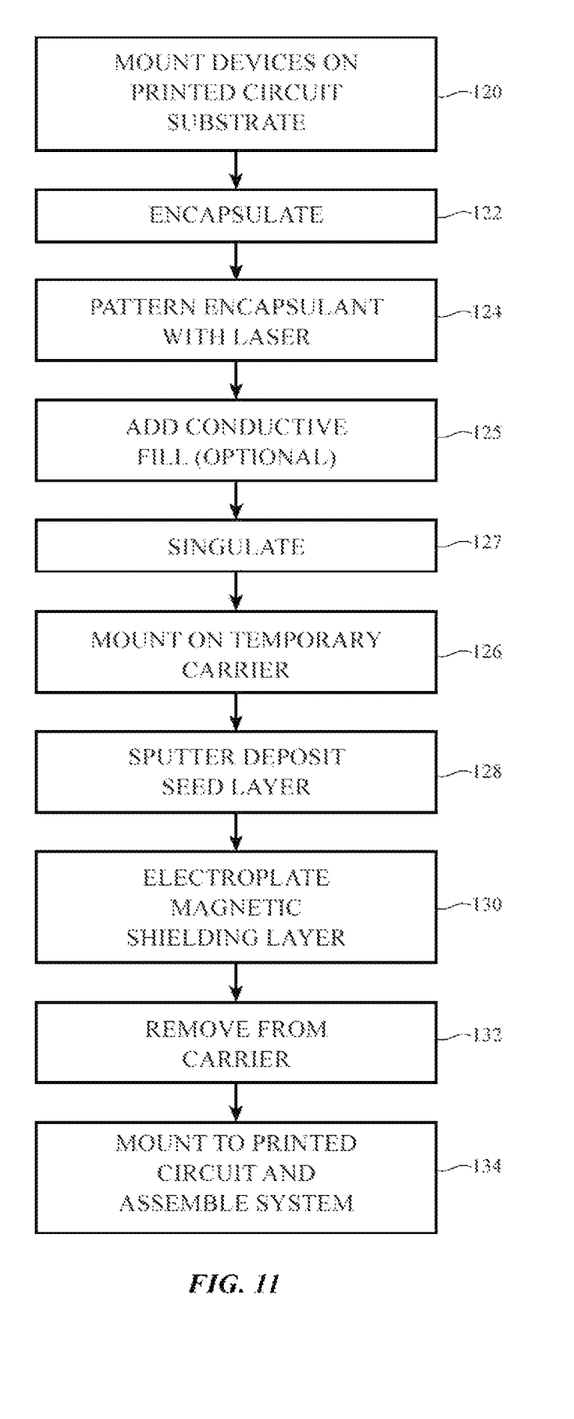
FIG. 11 is a flow chart of illustrative steps involved in forming devices such as system-in-package devices with shielding in accordance with an embodiment.

FIG. 11 is a flow chart of illustrative steps involved in forming shielded devices such as magnetically shielded system-in-package devices 22 for electronic device 10.

At step 120, electrical components such as integrated circuits 34 or other electrical components may be soldered or otherwise mounted on system-in-package substrates such as printed circuit substrates 30 using mounting tool 74A of FIG. 8 (see, e.g., packaging equipment 74 of FIG. 7).

At step 122, encapsulation tool 74B of FIG. 8 (see, e.g., packaging equipment 74 of FIG. 7) may be used to form dielectric encapsulation layer 38 over integrated circuits 34. Integrated circuits 34 and encapsulant 38 may be located on one or both sides of substrate 30.

If it is desired to form shielding walls 40W, groove formation equipment such as laser equipment 70 may be used to form grooves 80 in encapsulant 38 (e.g., to form a groove for a shielding wall to shield separate sets of integrated circuits 34 from each other).

At step 125, optional conductive epoxy or other conductive fill may be used to fill grooves 80 (e.g., to create shield wall 40W without need for sputtering, plating, etc.).

At step 127, strips or panels of system-in-package devices 22 may be diced or laser cut into individual system-in-package devices 22 (i.e., devices 22 may be singulated).

At step 126, mounting equipment 68 may be used to mount devices 22 on temporary carrier 84 (e.g., a printed circuit). When mounting devices 22, sealant 90 may be used to attach devices 22 to carrier 84 and to protect exposed contacts on devices 22, while the contacts on devices 22 mate with corresponding contacts on carrier 84.

At step 128, after mounting devices 22 on carrier 84, sputter deposition equipment (see, e.g., physical vapor deposition equipment 64 of FIG. 7 and tools 86 of FIG. 8) may be used to deposited a layer of metal onto the surface of encapsulant 38 (and thereby into grooves 80) to serve as an electroplating seed layer (layer 40-1).

Electroplating equipment 66P may then be used to electroplate layer 40-2 onto layer 40-1 at step 130. If desired, electroless deposition techniques may be used to plate layers of magnetic material, metal, and other layers onto device 22 (alone or in combination with electroplating and/or sputtering, etc). Moreover, one or more additional layers of material may be deposited (i.e., one or more layers of material other than seed layer 40-1 and electroplated layer 40-2), as illustrated by the multiple layers 42 of shield layer 40 of FIG. 2. The configuration of FIG. 11 is merely illustrative.

Following formation of shield layer 40 by electroplating layer 40-2 (or, if desired, using electroless deposition) and following formation of any desired additional layers for shielding layer 40 by sputtering, electroplating, electroless deposition, or other deposition techniques (see, e.g., layers 42 of FIG. 2), devices 22 may be removed from temporary carrier 84 (step 132).

At step 134, devices 22 may be mounted on printed circuits such as printed circuit 20 of FIG. 1 and printed circuit 20 and other electrical components for device 10 may be assembled using equipment 72 to form electronic device 10.

During operation of device 10, the magnetic shielding layer on system-in-package device 22 may help prevent undesired wireless interference between noise-generating components and sensitive components in device 10.

Figure 12:
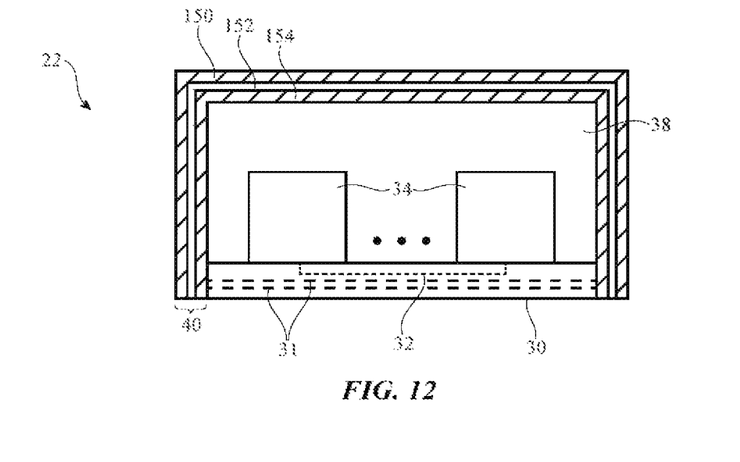
FIGS. 12, 13, and 14 are cross-sectional side views of illustrative packaged devices with magnetic shielding in accordance with embodiments.
Figure 13:
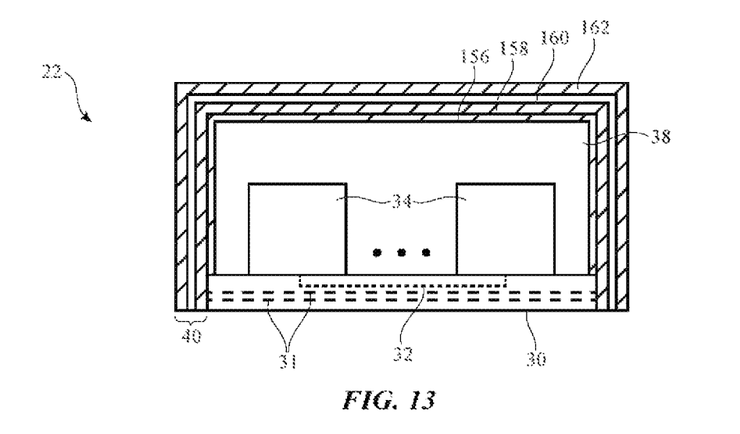
Figure 14:
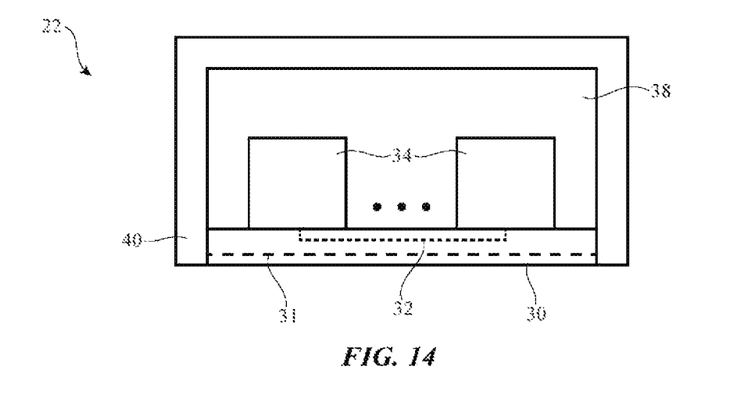

If desired, packaged devices such as device 22 may be formed using arrangements of the types shown in FIGS. 12, 13, and 14 and/or may be formed using combinations of these arrangements and the arrangement of FIGS. 3 and 4, and/or other suitable configurations. In the illustrative arrangements of FIGS. 12, 13, and 14, electrical components such as integrated circuits 34 may be soldered to the surface of printed circuit board substrate 30 and interconnected using patterned metal traces that form interconnects 32 in substrate 30. Substrate 30 may also have one or more embedded shielding layers 31 (e.g., a single shielding layer, two shielding layers, three shielding layers, four shielding layers, etc.). Shielding layers 31 may include high-conductivity metal that serves as radio-frequency shielding and/or magnetic material that serves as magnetic shielding. In the examples of FIGS. 12 and 13, there are two shielding layers 31 in each substrate 30 and in the example of FIG. 14 there is a single shielding layer 31 in substrate 30. This is merely illustrative. Substrates 30 of FIGS. 12 and 13 may have fewer than two layers 31 or more than two layers 31 and substrate 30 of FIG. 14 may have two or more layers 31.

Integrated circuits 34 may be encapsulated with encapsulation layer 38 and covered with shielding layers 40. Each layer 40 may include multiple sublayers, as described in connection with sublayers 42 of FIG. 2. To provide device 22 with satisfactory electromagnetic shielding, layer 40 may contain high-conductivity materials and/or magnetic materials. The resistivity of a high-conductivity metal layer in layer 40 and/or in layer 31 may be less than $2 \times 10^{-8}$ ohm-m, less than $3 \times 10^{-8}$ ohm-m, or other suitable amount. The relative permeability of the layer(s) of magnetic material in layer 40 and/or layer 31 may be 2000 or more, may be 5000 or more, may be 10,000 or more, may be 20,000 or more, may be 80,000 or more, may be 5,000-100,000, may be 50,000-100,000, be less than 100,000, or may have any other suitable value that allows the layer(s) to serve as magnetic shielding for device 22. The layers of material in layer 40 and/or layer(s) 31 may be deposited by sputtering or other physical vapor deposition processes, electroplating, spraying, printing, or other deposition techniques.

In the example of FIG. 12, layer 40 includes outer layer 150, inner layer 154, and intermediate layer 152. Additional layers may be provided or fewer layers may be provided in layer 40 if desired. Layer 40 of FIG. 12 may provide radio-frequency shielding for device 22 and may sometimes be referred to as a radio-frequency shielding layer. Layers 150 and 154 may be formed from a material such as stainless steel. Layer 152 may be a high conductivity layer such as a layer of copper or aluminum. Layer 154 may serve as an adhesion layer for layer 152. Layer 150 may serve as a corrosion protection layer.

Layer(s) 31 in substrate 30 of FIG. 12 may include copper layers or other high conductivity layers that serve as grounding and may, if desired, be shorted to the conductive materials in layer 40 to form a closed circuit for radio-frequency shielding. If desired, layer(s) 31 in substrate 30 of FIG. 12 may include one or more layers of magnetic material. The magnetic material may have high permeability (e.g., the relative permeability of the layer(s) 31 of magnetic material in layer 40 may be 2000 or more, may be 5000 or more, may be 10,000 or more, may be 20,000 or more, may be 80,000 or more, may be 5,000-100,000, may be 50,000-100,000, may be less than 100,000, or may have any other suitable value that allows layer(s) 31 to serve as magnetic shielding for device 22), may have high saturation magnetic induction flux (flux density), and may have low coercivity.

In the example of FIG. 13, layer 40 includes inner layer 156, intermediate layers 158 and 160, and outer layer 162. Layer 156 may be a stainless steel layer that covers encapsulant layer 38 and that serves as an adhesion layer for layer 158. Outer layer 162 may be formed from stainless steel or other material that provides corrosion protection for layer 40. Layer 158 may be a metal with a high conductivity such as copper or aluminum that serves a radio-frequency shielding for components 34. Layer 158 may be interposed between layer 156 and layer 160. Layer 160 may be formed from a magnetic material that forms a magnetic shield (e.g., a soft magnetic material with a relative permeability that may be 2000 or more, may be 5000 or more, may be 10,000 or more, may be 20,000 or more, may be 80,000 or more, may be 5,000-100,000, may be 50,000-100,000, may be less than 100,000, etc.). The placement of copper layer 158 under magnetic shield layer 160 may help ensure that there is a low resistance path between copper layers or other conductive layer(s) 31 in substrate 30 and layer 158, thereby ensuring that components 34 are enclosed within a sealed radio-frequency copper shield.

If desired, one or more of layers 31 in substrate 30 of FIG. 13 may be formed from magnetic material for forming a magnetic shield (i.e., in addition to or instead of forming layer(s) 31 from copper to form a radio-frequency shield, one or more of layers 31 may be formed from magnetic material with a relative permeability that may be 2000 or more, may be 5000 or more, may be 10,000 or more, may be 20,000 or more, may be 80,000 or more, may be 5,000-100,000, may be 50,000-100,000, may be less than 100,000, etc.).

In the illustrative configuration of FIG. 14, layer 40 includes a single layer of material such as a single layer of magnetic material for magnetic shielding (e.g., a single layer of material with a relative permeability that may be 2000 or more, may be 5000 or more, may be 10,000 or more, may be 20,000 or more, may be 80,000 or more, may be 5,000-100,000, may be 50,000-100,000, may be less than 100,000, etc.). There may be one or more layers such as layer 31 in substrate 30 that serve as shielding (e.g., one or more copper or aluminum layers or other layers with a high conductivity to serve as radio-frequency shielding, one or more layers of magnetic material for magnetic shielding, etc.). Layer 31 may, for example, be a magnetic material with a relative permeability that may be 2000 or more, may be 5000 or more, may be 10,000 or more, may be 20,000 or more, may be 80,000 or more, may be 5,000-100,000, may be 50,000-100,000, may be less than 100,000, etc.

Layer 40 of FIG. 14 and the sublayers in layers 40 of FIGS. 12 and 13 may be formed using sputtering, plating, spraying, printing, and/or other suitable deposition techniques. If desired, sputtered layers of stainless steel and/or copper or other material may serve as seed layers for plated material (e.g., plated magnetic material, etc.). Layers 31 and the layers of material in layers 40 may include high-conductivity metals (copper, aluminum, etc.) and/or may include magnetic materials. Each layer 31 may include a single material or, if desired, one or more of the layers of material embedded in substrate 30 may include multiple stacked layers of material (e.g., two or more sublayers). In arrangements of the type shown in FIG. 14, the soft magnetic material that is used in forming layer 40 may have a both high permeability and good conductivity, thereby allowing layer 40 to serve as a broad-band (large frequency range) shielding layer. In this type of configuration, a magnetic material layer (in layer 40 and/or layer 31) may serve as both radio-frequency and magnetic shielding.

The foregoing is merely illustrative and various modifications can be made by those skilled in the art without departing from the scope and spirit of the described embodiments. The foregoing embodiments may be implemented individually or in any combination.

What is claimed is:
1. A magnetically shielded device, comprising:
   a substrate;
   at least one electrical component mounted on the substrate;
   an encapsulation layer having first and second opposing surfaces, wherein the first surface is coupled to the substrate covering the component;
   a magnetic shielding layer on the encapsulation layer formed from a sputtered seed layer and an electroplated layer of magnetic material;
   a shielding layer in the encapsulation layer, wherein the shielding layer comprises magnetic material; and
   at least one shielding wall formed from a portion of the shielding layer, wherein the at least one shielding wall completely fills a groove in the encapsulation layer up to the second surface.

2. The magnetically shielded device defined in claim 1 wherein the at least one electrical component comprises a plurality of integrated circuit dies soldered to the substrate and wherein the encapsulation layer covers the plurality of integrated circuit dies.

3. The magnetically shielded device defined in claim 2 wherein the electroplated layer of magnetic material comprises an electroplated material selected from the group consisting of: NiFe, CoZrTa, Co, mu-metal, and permalloy.

4. The magnetically shielded device defined in claim 3 wherein the substrate has a first surface to which the integrated circuit dies are soldered and an opposing second surface, wherein the substrate has metal traces that form a ground contact on the second surface, and wherein the electroplated layer of magnetic material is formed by passing electroplating current through the ground contact.

5. The magnetically shielded device defined in claim 3 further comprising a coating layer of non-corrosive material on the electroplated layer of magnetic material.

6. The magnetically shielded device defined in claim 3 wherein the substrate has opposing first and second sides and wherein some of the integrated circuit dies are mounted to the first side and some of the integrated circuit dies are mounted to the second side.

7. The magnetically shielded device defined in claim 6 wherein the electroplated shielding layer shields the integrated circuit dies on the first side and the integrated circuit dies on the second side.

8. A magnetically shielded device, comprising:
   a substrate;
   at least one electrical component mounted on the substrate;
   an encapsulation layer having first and second opposing surfaces, wherein the first surface is coupled to the substrate covering the electrical component;
   a magnetic shielding layer in the substrate, wherein the magnetic shielding layer comprises magnetic material;
   a shielding layer on the encapsulation layer; and
   at least one shielding wall formed from a portion of the shielding layer, wherein the at least one shielding wall completely fills a groove in the encapsulation layer up to the second surface.

9. The magnetically shielded device defined in claim 8 wherein the shielding layer includes first, second, and third layers of material.

10. The magnetically shielded device defined in claim 9 wherein the first and third layers of material comprise stainless steel and wherein the second layer of material is interposed between the first and third layers of material.

11. The magnetically shielded device defined in claim 10 wherein the second layer of material comprises copper.

12. The magnetically shielded device defined in claim 10 wherein the second layer of material comprises a magnetic material that serves as magnetic shielding.

13. The magnetically shielded device defined in claim 12 wherein the second layer of material comprises a magnetic material with a relative permeability of at least 10000.

14. The magnetically shielded device defined in claim 8 wherein the at least one electrical component comprises a plurality of integrated circuits, wherein the substrate comprises a printed circuit board having interconnects that interconnect the integrated circuits, and wherein the interconnects are interposed between the magnetic shielding layer and the interconnects.

15. The magnetically shielded device defined in claim 14 wherein the shielding layer includes first, second, third, and fourth layers of material.

16. The magnetically shielded device defined in claim 15 wherein the third layer of material comprises a magnetic material that serves as magnetic shielding.

17. The magnetically shielded device defined in claim 16 wherein the second layer of material comprises a metal layer.

18. The magnetically shielded device defined in claim 17 wherein the first layer of material is an inner layer formed on the encapsulation layer, wherein the fourth layer of material is an outer layer, wherein the inner layer comprises stainless steel, wherein the outer layer comprises stainless steel, wherein the third layer is interposed between the outer layer and the second layer of material, and wherein the second layer of material is interposed between the third layer of material and the inner layer.

19. The magnetically shielded device defined in claim 8 wherein the magnetic shielding layer comprises a sputtered magnetic shielding layer and wherein the shielding layer on the encapsulation comprises a sputtered shielding layer.

20. The magnetic shielding device defined in claim 8 wherein the magnetic shielding layer comprises an electrolessly plated shielding layer and wherein the shielding layer on the encapsulation comprises an electrolessly plated shielding layer.

21. The magnetically shielded device defined in claim 8 wherein the groove has a tapered profile.

22. The magnetically shielded device defined in claim 8 further comprising a contact on the substrate, wherein the shield wall that completely fills the groove extends to the contact, wherein the contact comprises a solder pad.

23. The magnetically shielded device defined in claim 8 wherein the shielding layer is formed from a sputter seed layer and an electroplated layer of magnetic material.

24. The magnetically shielded device defined in claim 23 wherein the electroplated layer of magnetic material comprises an electroplated material selected from the group consisting of: CoZrTa, Co, mu-metal, and permalloy.

25. The magnetically shielded device defined in claim 24 wherein the substrate has a first surface to which the electrical component is soldered and an opposing second surface, wherein the substrate has metal traces that form a ground contact on the second surface, and wherein the electroplated layer of magnetic material is formed by passing electroplating current through the ground contact.

26. The magnetically shielded device defined in claim 24 further comprising a coating layer of non-corrosive material on the electroplated layer of magnetic material.

27. A magnetically shielded device, comprising:
 a printed circuit board substrate, wherein the printed circuit board substrate has first and second opposing sides and wherein the printed circuit board substrate has first and second opposing surfaces;
 a plurality of integrated circuits mounted on the first surface of the substrate that are interconnected by interconnects in the printed circuit board substrate;
 an encapsulation layer having first and second surfaces, wherein the first surface is coupled to the printed circuit board substrate, covering the integrated circuits;
 a plurality of shielding layers in the substrate that extend completely from the first side of the substrate to the second side of the substrate;
 a shielding layer on the encapsulation layer that includes a metal layer and a layer of magnetic material; and
 at least one shielding wall formed from a portion of the shielding layer, wherein the at least one shielding wall penetrates into and completely fills a groove in the encapsulation layer, wherein the at least one shielding wall extends from the first to the second surface.

28. The magnetically shielded device defined in claim 27 wherein the metal layer comprises a metal selected from the group consisting of: copper and aluminum and wherein the layer of magnetic material comprises a material having a relative permeability of at least 10000.

29. The magnetically shielded device defined in claim 28 wherein the layer on the encapsulation layer comprises a first stainless steel layer interposed between the metal layer and the encapsulation layer and comprises a second stainless steel layer, wherein the layer of magnetic material is interposed between the second stainless steel layer and the metal layer.

30. The magnetically shielded device defined in claim 27 wherein at least one of the shielding layers of the plurality of shielding layers comprises magnetic material.

* * * * *